(12) United States Patent
Busi et al.

(10) Patent No.: US 9,761,329 B2
(45) Date of Patent: Sep. 12, 2017

(54) BUILT-IN SELF-TEST (BIST) CIRCUIT AND ASSOCIATED BIST METHOD FOR EMBEDDED MEMORIES

(71) Applicant: GLOBALFOUNDRIES INC., Grand Cayman (KY)

(72) Inventors: Aravindan J. Busi, Bangalore (IN); Deepak I. Hanagandi, Bagalkot (IN); Krishnendu Mondal, Bangalore (IN); Michael R. Ouellette, Westford, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 37 days.

(21) Appl. No.: 14/918,149

(22) Filed: Oct. 20, 2015

(65) Prior Publication Data
US 2017/0110205 A1    Apr. 20, 2017

(51) Int. Cl.
*G11C 29/38*    (2006.01)
*G11C 29/18*    (2006.01)
*G11C 29/44*    (2006.01)
*G11C 29/04*    (2006.01)

(52) U.S. Cl.
CPC .............. *G11C 29/38* (2013.01); *G11C 29/18* (2013.01); *G11C 29/44* (2013.01); *G11C 2029/0401* (2013.01)

(58) Field of Classification Search
CPC ......... G11C 29/18; G11C 29/38; G11C 29/44; G11C 29/56004; G11C 2207/104; G11C 2029/0401; G11C 29/16; G06F 11/263; G06F 11/27; G06F 11/2733
See application file for complete search history.

(56) References Cited

U.S. PATENT DOCUMENTS

| | | | |
|---|---|---|---|
| 5,974,579 A | 10/1999 | Lepejian et al. | |
| 5,983,009 A | 11/1999 | Lepejian et al. | |
| 6,388,930 B1 | 5/2002 | Obremski | |
| 6,425,103 B1 | 7/2002 | Phan | |
| 6,553,527 B1 * | 4/2003 | Shephard, III | G01R 31/3187 714/725 |
| 6,769,081 B1 | 7/2004 | Parulkar | |
| 7,114,024 B2 * | 9/2006 | Herbst | H04L 12/56 369/53.17 |
| 7,181,659 B2 | 2/2007 | Bravo et al. | |

(Continued)

*Primary Examiner* — Phung M Chung
(74) *Attorney, Agent, or Firm* — Gibb & Riley, LLC; Anthony J. Canale

(57) ABSTRACT

An integrated circuit chip with a built-in self-test (BIST) circuit having a BIST engine, which is electrically connected to multiple memories, which tests those multiple memories in parallel, and which incorporates an address generator. Prior to testing, the address generator generates a pair of tables. The tables include a first table, which indicates the highest decode numbers per specific bank numbers in all of the multiple memories, and a second table, which indicates the highest bank numbers per specific decode numbers in all of the multiple memories. During testing, the address generator sequentially and dynamically generates the specific test addresses to be swept and does so such that all of the specific test addresses are within a composite address space that is defined by one of the tables and by the highest maximum word line number in any of the memories. Also disclosed is an associated BIST method.

20 Claims, 8 Drawing Sheets

(56) References Cited

U.S. PATENT DOCUMENTS

| | | |
|---|---|---|
| 7,757,141 B2 | 7/2010 | Chickanosky et al. |
| 7,814,380 B2 | 10/2010 | Averbuj et al. |
| 7,870,454 B2 | 1/2011 | Gorman et al. |
| 7,945,823 B2 | 5/2011 | Doddamane et al. |
| 8,639,994 B2* | 1/2014 | Chen .................. G11C 29/06 714/718 |
| 8,914,688 B2 | 12/2014 | Belansek et al. |
| 2008/0098269 A1 | 4/2008 | Bhavsar et al. |
| 2011/0029827 A1 | 2/2011 | Chickanosky et al. |
| 2012/0229155 A1* | 9/2012 | Anzou .................. G11C 29/16 324/750.3 |
| 2014/0129888 A1 | 5/2014 | Chickanosky et al. |
| 2014/0189448 A1 | 7/2014 | Hanagandi et al. |
| 2014/0258797 A1 | 9/2014 | Gorman et al. |

* cited by examiner

| Clock Number After RESET | MUX Select Input Value For Each Specific Address Space Value | Specific Address Space Value |
|---|---|---|
| 0 | "1000" | Maximum Decode Value For Bank 1 |
| 1 | "0111" | Maximum Decode Value For Bank 2 |
| 2 | "0110" | Maximum Decode Value For Bank 4 |
| 3 | "0101" | Maximum Bank Value For Decode 4 |
| 4 | "0100" | Maximum Bank Value For Decode 8 |
| 5 | "0011" | Maximum Bank Value For Decode 16 |
| 6 | "0010" | Maximum Bank Value For Decode 32 |
| 7 | "0001" | Maximum Word Address |
| 8 | "0000" | {EXTRA_BIT, BIEXIST,SBSHIFT,SBSTOP} |

FIG. 5

DECODE AND BANK BITS INDEX

| Decode Bits | | Bank Bits | |
|---|---|---|---|
| Decode 32 | 1 1 1 1 | Bank 04 | X 1 1 1 |
| Decode 16 | 0 1 1 1 | Bank 02 | X 0 1 1 |
| Decode 08 | 0 0 1 1 | Bank 01 | X 0 0 1 |
| Decode 04 | 0 0 0 1 | No Bank | X 0 0 0 |
| No Decode | 0 0 0 0 | | |

FIG. 6

BUILT-IN SELF-TEST (BIST) CIRCUIT AND ASSOCIATED BIST METHOD FOR EMBEDDED MEMORIES

FIELD OF THE INVENTION

The present disclosure relates to built-in self-test (BIST) of embedded memories on an integrated circuit chip and, specifically, to BIST circuits and methods that provide for dynamically setting the size of the address space to be swept during testing in order to reduce test time.

BACKGROUND

With advances in technologies and device scaling, integrated circuit chip designs incorporate an increasingly large number of embedded memories (also referred to herein as embedded memory arrays) as well as built-in self-test (BIST) circuits for testing such embedded memories, when operating in a test mode (as opposed to a functional mode). Oftentimes an integrated circuit chip design will incorporate multiple BIST engines controlled by a BIST controller and each BIST engine will test multiple embedded memories of the same specific type (e.g., multiple static random access memory arrays (SRAMs), multiple dynamic random access memory arrays (DRAMs), etc.) in parallel.

In this case, the BIST engine has an address generator and a test pattern generator. The address generator generates multiple test addresses and, specifically, generates test addresses corresponding to all addresses in a maximum possible address space, which is associated with the specific type of memory under test and equal to a maximum number of banks in the memory multiplied by a maximum number of word lines per bank multiplied by a maximum decode number per data bit column. The test pattern generator generates test patterns to be applied to these test addresses in the memories under test. Then, the BIST engine sweeps through the address space of each memory, writing the test patterns to the test addresses. The output is then read and analyzed by comparison logic in an input/output interface, which allows for communication between the BIST engine and a corresponding memory under test, in order to confirm that the memory cells at the various test addresses in that corresponding memory are functioning properly.

Oftentimes, however, the memories tested by a given BIST engine may have address spaces that are less than the maximum possible address space associated with the specific type of memory under test and, specifically, may have a lesser number of banks than the predetermined maximum number of banks, a lesser number of word lines per bank than the predetermined maximum number of word lines per bank and/or a lesser decode number per data bit column than the predetermined maximum decode number per data bit column. To accommodate the overabundance of test addresses generated by the BIST engine in such cases and to enable in parallel testing of memories of different sizes (i.e., in parallel testing of memories with different total address spaces), each input/output interface block connected between the BIST engine and a corresponding memory is typically configured to sort in-range test addresses (i.e., test addresses that are received from the BIST engine and that are within the address space for the corresponding memory) from out-of-range test addresses (i.e., test addresses that are received from the BIST engine and that are above the address space for the corresponding memory). Although testing of memories of different sizes can be performed by such BIST circuits, sweeping the maximum possible address space can be a significant waste of time, particularly, when relatively small memories are tested.

SUMMARY

Disclosed herein is an integrated circuit chip with multiple memories and a built-in self-test (BIST) circuit. The BIST circuit can have a BIST engine, which is electrically connected to the multiple memories, which tests those multiple memories in parallel, and which incorporates an address generator configured to minimize that address space swept during testing. Specifically, prior to testing of the multiple memories, the address generator can generate a pair of tables. The tables can include a first table, which indicates the highest decode numbers per specific bank numbers in all of the multiple memories, and a second table, which indicates the highest bank numbers per specific decode numbers in all of the multiple memories. Then, during testing of the multiple memories, the address generator can sequentially and dynamically generate the specific test addresses to be swept (i.e., the addresses of the memory cells that will execute test patterns generated by a test pattern generator of the BIST engine during the testing process) and can do so such that all of the specific test addresses are within a composite address space that is defined by one of the tables (i.e., by either the first table or the second table, depending upon the address sweep mode being used) and by the highest maximum word line number in any of the memories. Depending upon the actual configuration of the memories, this composite address space may be less than a maximum possible address space associated with the multiple memories. Sweeping the composite address space as opposed to the maximum possible address space may result in a significantly reduced test time.

More specifically, the integrated circuit chip can have multiple memories and a built-in self-test (BIST) circuit for testing those memories. The BIST circuit can incorporate a BIST engine and pairs of serially connected input/output interface blocks that electrically connect multiple memories in parallel to the BIST engine.

Each pair of serially connected input/output interface blocks can include a first input/output interface block (e.g., a slow BIST input/output interface block (SBIO)) electrically connected to the BIST engine and a second input/output interface block (e.g., a fast BIST input/output interface block (FBIO)) electrically connected between the first input/output interface block and a corresponding memory.

Each first input/output interface block in each pair can store a set of eight address space values for the corresponding memory. The set of eight address space values can include the following: a first address space value, which indicates a first maximum decode number per a first specific bank number in the corresponding memory; a second address space value, which indicates a second maximum decode number per a second specific bank number in the corresponding memory; a third address space value, which indicates a third maximum decode number per a third specific bank number in the corresponding memory; a fourth address space value, which indicates a first maximum bank number per a first specific decode number in the corresponding memory; a fifth address space value, which indicates a second maximum bank number per a second specific decode number in the corresponding memory; a sixth address space value, which indicates a third maximum bank number per a third specific decode number in the corresponding memory; a seventh address space value, which indicates a fourth maximum bank number per a fourth specific decode number in the corresponding memory; and, an eighth address space value, which indicates a maximum word line number per any bank in the corresponding memory.

Each first input/output interface block in each pair can further contain both a multiplexer and a state machine. The state machine can control the multiplexer by outputting a given number of different select signals in sequence, thereby causing the multiplexer to output specific information along a set of signal lines to the BIST engine prior to testing and, optionally, during and/or after testing, as described in detail below. Specifically, following receipt by the state machine of a reset signal and prior to testing, the state machine can output eight different select signals in sequence, thereby causing the multiplexer to output, to the BIST engine in sequence along the set of specific signal lines, each of the eight address space values within the set.

The BIST engine can have an address generator. This address generator can receive sets of address space values for all of the multiple memories from all first input/output interface blocks, respectively, and can generate a pair of tables based on those sets. The pair of tables can include a first table, which indicates the highest maximum decode numbers per specific bank numbers in all of the multiple memories, and a second table, which indicates the highest maximum bank numbers per specific decode numbers in all of the multiple memories. Then, during testing, the address generator can sequentially and dynamically generate specific test addresses to which test patterns are applied such that all of the specific test addresses are within an address space defined by one of the tables (i.e., either the first table or the second table, depending upon the address sweep mode being used) and by the highest maximum word line number in any of the multiple memories. Depending upon the actual configuration of the memories, this composite address space may be less than the maximum possible address space associated with the multiple memories. Thus, sweeping the composite address space as opposed to the maximum possible address space associated with the multiple memories may result in a significantly reduced test time.

It should be noted that, optionally, the state machine can output nine different select signals in sequence (as opposed to the eight different select signals mentioned above) so as to cause the multiplexer to output, to the BIST engine along sets of signal lines, each of the eight address space values in the set prior to testing and also to output BIST operational signal(s) during and/or after testing. In this case, the same set of signal lines used for transmitting address space value information from the first input/output interface block (e.g., the SBIO) to the BIST engine prior to testing are used to communicate BIST operational signals between the first input/output interface block (e.g., the SBIO) and the BIST engine during and/or after testing. Thus, eight different select signals cause transmission of the eight address space values, respectively, to the BIST engine along the set of signal lines and a ninth select signal subsequently allows the same set of signal lines to return to their operational function.

Also disclosed is a built-in self-test (BIST) method for testing multiple memories in parallel on an integrated circuit chip. In this method, a pair of tables can be generated by an address generator of a BIST engine that is electrically connected to multiple memories on an integrated circuit. The pair of tables can include a first table, which indicates the highest maximum decode numbers per specific bank numbers in all of the multiple memories, and a second table, which indicates the highest maximum bank numbers per specific decode numbers in all of the multiple memories.

Following generation of these tables, the multiple memories can be tested in parallel by the BIST engine. During this testing process, specific test addresses to which test patterns will be applied can be sequentially and dynamically generated by the address generator such that they are all within a composite address space defined by one of the tables (i.e., either the first table or the second table, depending upon the address sweep mode being used) and by the highest maximum word line number in any of the multiple memories. Depending upon the actual configuration of the memories, this composite address space may be less than the maximum possible address space associated with the multiple memories. Thus, sweeping the composite address space as opposed to the maximum possible address space associated with the multiple memories may result in a significantly reduced test time.

BRIEF DESCRIPTION OF THE DRAWINGS

The circuits and methods herein will be better understood from the following detailed description with reference to the drawings, which are not necessarily drawn to scale and in which:

FIG. 5 is a table illustrating exemplary select signals causing transmission of specific address space values to the BIST engine;

FIG. 6 is an index illustrating exemplary decode and bank bits representative of the specific address space values transmitted to the BIST engine; and, FIG. 7 is a flow diagram illustrating a built-in self-test (BIST) method for testing a plurality of memories.

DETAILED DESCRIPTION

Figure 1A:
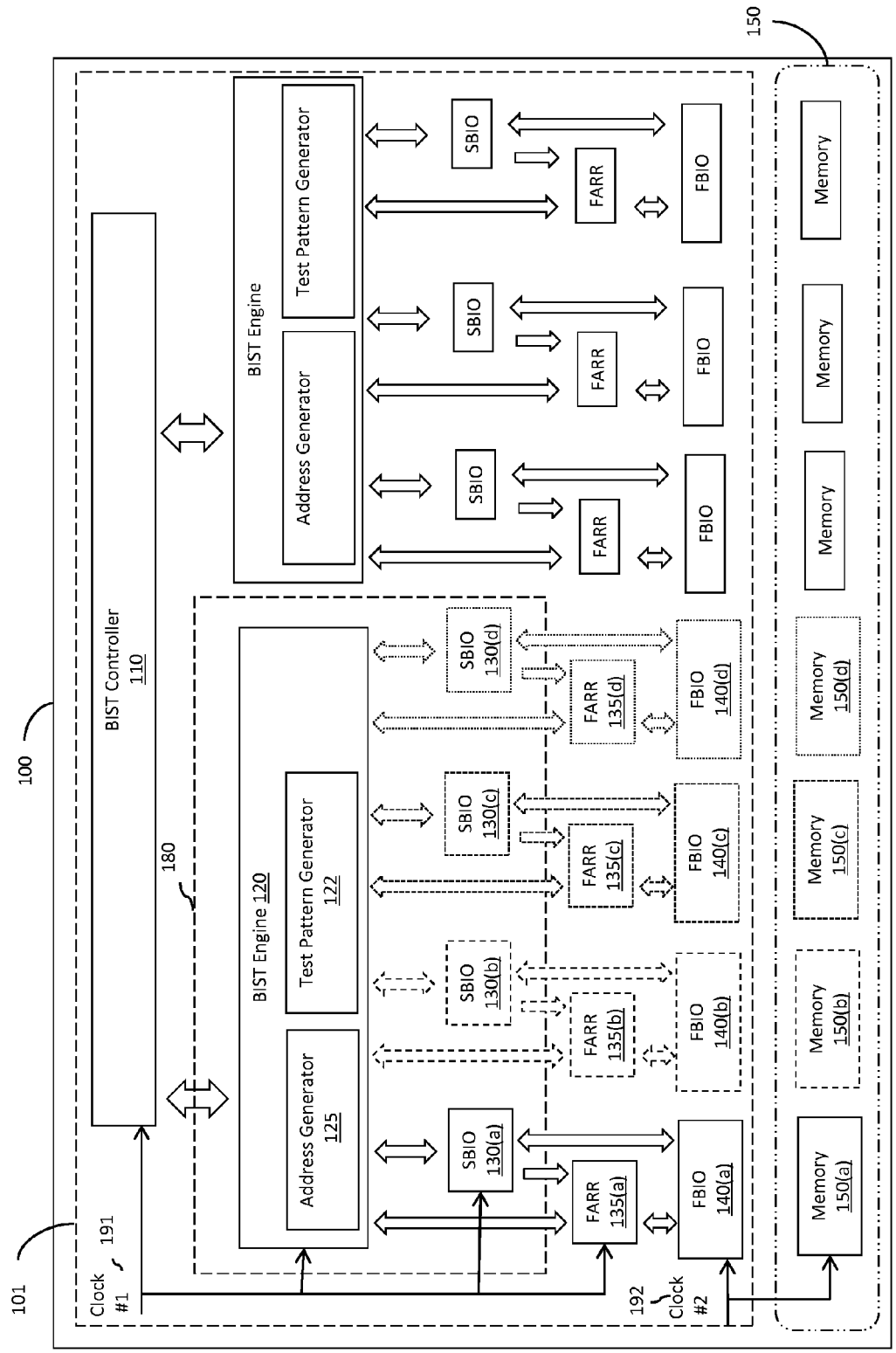
FIG. 1A is a schematic drawing illustrating an integrated circuit chip with a built-in self-test (BIST) circuit for testing a plurality of memories.

As mentioned above, with advances in technologies and device scaling, integrated circuit chip designs incorporate an increasingly large number of embedded memories (also referred to herein as embedded memory arrays) as well as built-in self-test (BIST) circuits for testing such embedded memories, when operating in a test mode (as opposed to a functional mode). Oftentimes an integrated circuit chip design will incorporate multiple BIST engines controlled by a BIST controller and each BIST engine will test multiple embedded memories of the same specific type (e.g., multiple static random access memory arrays (SRAMs), multiple dynamic random access memory arrays (DRAMs), etc.) in parallel.

In this case, the BIST engine has an address generator and a test pattern generator. The address generator generates multiple test addresses and, specifically, generates test addresses corresponding to all addresses in maximum possible address space, which is associated with the specific type of memory under test and equal to a maximum number of banks multiplied by a maximum number of word lines per bank multiplied by a maximum decode number per data bit column. The test pattern generator generates test patterns to be applied to these test addresses in the memories under test. Then, the BIST engine sweeps through the address space of each memory, writing the test patterns to the test addresses. The output is then read and analyzed by comparison logic in an input/output interface, which allows for communication between the BIST engine and a corresponding memory under test, in order to confirm that the memory cells at the various test addresses in that corresponding memory are functioning properly.

Oftentimes, however, the memories tested by a given BIST engine may have address spaces that are less than the maximum possible address space for the specific type of memory under test and, specifically, may have a lesser number of banks than the predetermined maximum number of banks, a lesser number of word lines per bank than the predetermined maximum number of word lines per bank and/or a lesser decode number per data bit column than the predetermined maximum decode number per data bit column. To accommodate the overabundance of test addresses generated by the BIST engine in such cases and to enable in parallel testing of memories of different sizes (i.e., in parallel testing of memories with different total address spaces), each input/output interface block connected between the BIST engine and a corresponding memory is configured to sort in-range test addresses (i.e., test addresses that are received from the BIST engine and that are within the address space for the corresponding memory) from out-of-range test addresses (i.e., test addresses that are received from the BIST engine and that are above the address space for the corresponding memory). Although testing of memories of different sizes can be performed by such BIST circuits, sweeping the maximum possible address space can be a significant waste of time, particularly, when relatively small memories are tested.

In view of the foregoing, disclosed herein is an integrated circuit chip with multiple memories and a built-in self-test (BIST) circuit. The BIST circuit can have a BIST engine, which is electrically connected to the multiple memories, which tests those multiple memories in parallel, and which incorporates an address generator configured to minimize that address space swept during testing. Specifically, prior to testing of the multiple memories, the address generator can generate a pair of tables. The tables can include a first table, which indicates the highest decode numbers per specific bank numbers in all of the multiple memories, and a second table, which indicates the highest bank numbers per specific decode numbers in all of the multiple memories. Then, during testing of the multiple memories, the address generator can sequentially and dynamically generate the specific test addresses to be swept (i.e., the addresses of the memory cells that will execute test patterns generated by a test pattern generator of the BIST engine during the testing process) and can do so such that all of the specific test addresses are within a composite address space that is defined by one of the tables (i.e., by either the first table or the second table, depending upon the address sweep mode being used) and by the highest maximum word line number in any of the memories. Depending upon the actual configuration of the memories, this composite address space may be less than a maximum possible address space associated with the multiple memories. Sweeping the composite address space as opposed to the maximum possible address space may result in a significantly reduced test time.

Figure 1B:
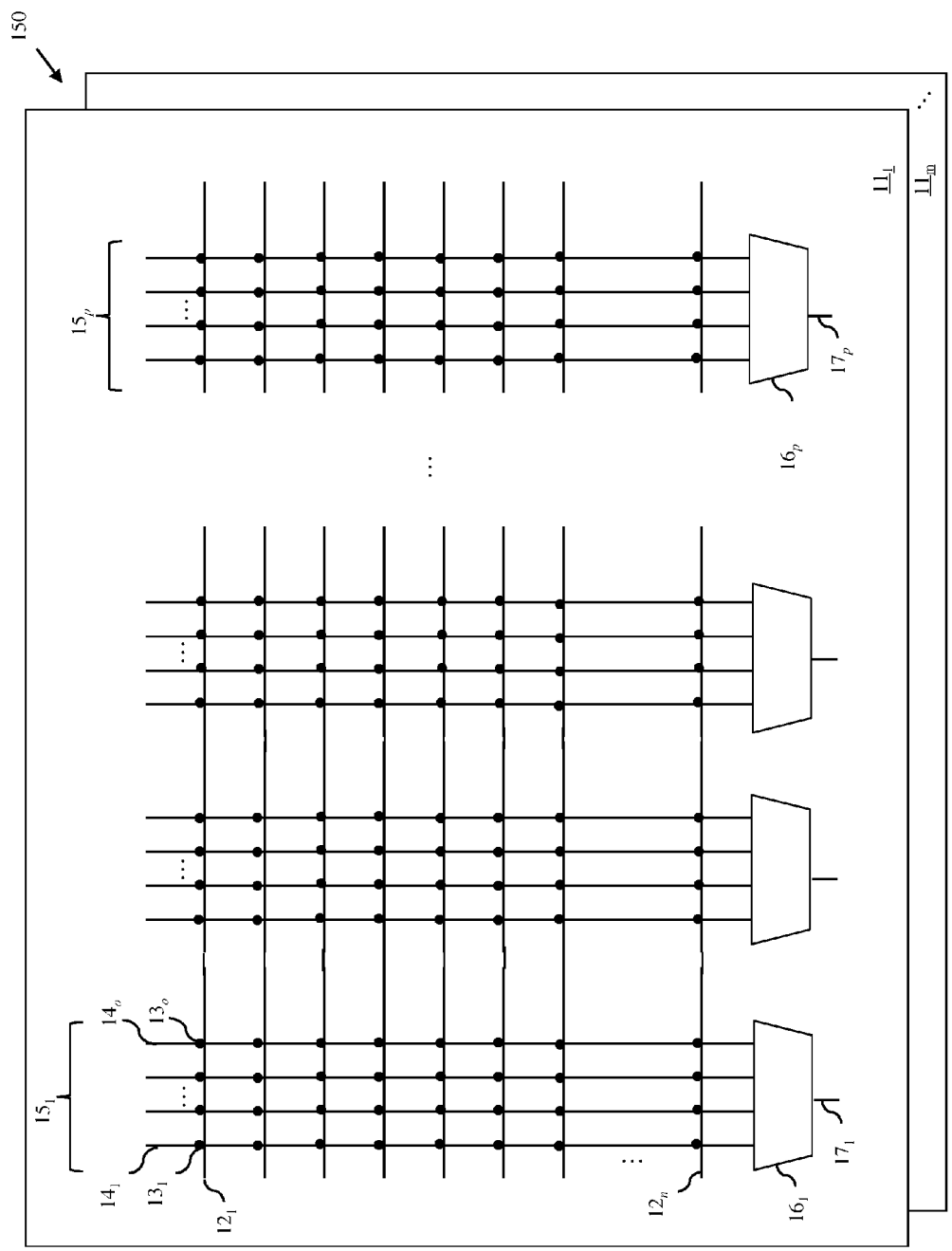
FIG. 1B is a schematic drawing illustrating an exemplary memory on the integrated circuit chip of FIG. 1A and suitable for testing by the BIST circuit.

More particularly, referring to FIGS. 1A and 1B disclosed herein is an integrated circuit chip 100. As illustrated in FIG. 1A, this integrated circuit chip 100 can incorporate a plurality of memories 150 and a built-in self-test (BIST) circuit 101 for testing those memories 150.

As illustrated in FIG. 1B, each of the memories 150 can have one or more memory banks $11_1$-$11_m$, where the number m is the total number of banks and where each bank is essentially identical. Each memory Bank $11_1$-$11_m$ can have one or more word lines $12_1$-$12_n$ (corresponding to rows), where the number n is the total number of word lines per bank. Each memory Bank $11_1$-$11_m$ can also have one or more data bit columns $15_1$-$15_p$, where the number p is the total number of data bit columns per bank and where the data bit columns are essentially identical. Each data bit column $15_1$-$15_p$ can traverse the word lines $12_1$-$12_n$ so as to incorporate adjacent sections of the word lines $12_1$-$12_n$. Each data bit column $15_1$-$15_p$ can further have one or more memory cells $13_1$-$13_o$ electrically connected to each of those adjacent sections of the word lines $12_1$-$12_n$ and one or more bit lines $14_1$-$14_o$ (corresponding to columns) electrically connected to the memory cells $13_1$-$13_o$, respectively, at the adjacent sections of the word lines $12_1$-$12_n$. Thus, the number o corresponds to the number of memory cells electrically connected to each adjacent section of each word line in a data bit column as well as the corresponding number of bit lines connected to the memory cells in the data bit column. This number o is referred to herein as the decode number (i.e., a decode o). Each data bit column $15_1$-$15_p$ can, in the case of multiple bit lines (i.e., multiple columns) per data bit column, further have a corresponding multiplexer $16_1$-$16_p$ that receives, as inputs, signals from the bit lines $14_1$-$14_o$ and outputs a single data bit $17_1$-$17_p$, respectively. In such a memory, the number p of data bit columns is the same as the number p of single data bits output and is referred to as the data bit width. In order to read or write to the memory, a memory address of a set number of bits including bank address bits, which specify a particular one of the banks $11_1$-$11_m$, as well as word address bits and decode address bits, which in combination specify the same memory cell (i.e., the same particular word line and bit line intersection) to be accessed (i.e., read from or written to) in each of the data bit columns. The actual total address space is equal to the number m of banks multiplied by the number n of word lines per bank multiplied by the decode number o per data bit column.

For purposes of illustration, FIG. 1A shows an integrated circuit chip 100 having seven discrete memories 150; however, it should be understood that the integrated circuit chip 100 can have any number of two or more memories 150. The BIST circuit 101 can have at least one BIST engine 120 controlled by a BIST controller 110. For illustration purposes, FIG. 1A shows two discrete BIST engines controlled by the BIST controller 110; however, it should be understood that this BIST circuit 101 could, alternatively, have any number of one or more BIST engines controlled by the BIST controller 110.

At least one BIST engine (e.g., BIST engine 120) in the BIST circuit 101 can be electrically connected to multiple memories of the plurality of memories 150 and can be configured to test those memories in parallel. For illustration purposes, the BIST engine 120 is shown in FIG. 1A as being electrically connected to four memories 150(a), 150(b), 150(c) and 150(d)); however, it should be understood that BIST engine 120 could, alternatively, be electrically connected to any number of two or more memories. These memories 150(a)-(d) can be the same type of memories and can be configured for example as illustrated in FIG. 1B. The memories 150(a)-(d) can all be dynamic random access memory (DRAM) arrays, static random access memory (SRAM) arrays, or any other specific type of memory arrays, etc. Each of these memories can further be associated with a maximum possible address space. These memories 150(a)-(d) can have the exact same configuration (e.g., the same number of banks, the same number of word lines per bank and the same decode number per data bit column such that they each have the same total address space. Alternatively, any two or more of the memories 150(a)-(d) can have different configurations (e.g., different numbers of banks, different numbers of word lines per bank and/or different decode numbers per data bit column) such that they have different total address spaces.

For example, memories 150(a)-(d) can all have the same type of memory array having a maximum possible size of 4 banks, 512 word lines per bank and a decode number of 32 (i.e., a Decode 32) and, thereby a maximum possible address space of 65,536 addresses. The memory 150(a) can have 1 bank, each with 256 word lines and a decode number of 32 for a total address space of 8192 addresses; memory 150(b) can have 4 banks, each with 128 word lines and a decode number of 4 for a total address space of 2048 addresses; memory 150(c) can have 2 banks, each with 16 word lines and a decode number of 16 for a total address space of 512 addresses; and memory 150(d) can have 4 banks, each with 16 word lines and a decode number of 8 for a total address space of 512 addresses.

The BIST circuit 101 can further have pairs of serially connected input/output interface blocks that electrically connect the multiple memories 150(a)-(d) in parallel to the BIST engine 120 and that enable communication between the BIST engine 120 and the multiple memories 150(a)-(d). Each pair 130(a)/140(a), 130(b)/140(b), 130(c)/140(c), 130(d)/140(d) of serially connected input/output interface blocks can have a first input/output interface block 130(a), 130(b), 130(c), 130(d) (e.g., a slow BIST input/output interface block (SBIO)) electrically connected to the BIST engine 120 and a second input/output interface block 140(a), 140(b), 140(c), 140(d) (e.g., a fast BIST input/output interface block (FBIO)) electrically connected between the first input/output interface block 130(a), 130(b), 130(c), 130(d) and a corresponding memory 150(a), 150(b), 150(c), 150(d), respectively. The BIST circuit 101 can further incorporate failing address and repair registers (FARRs) 135(a)-(d), which are in communication with the first input/output interface blocks 130(a)-(d) and the second input/output interface blocks 140(a)-(d), respectively, and which are also in communication with the BIST engine 120. The BIST controller 110, the BIST engine 120, the first input/output interface blocks 130(a)-(d) and the FARRs 135(a)-(d) can all be controlled by a common first clock signal 191. The memories 150(a)-(d) and the second input/output interface blocks 140(a)-(d) can be controlled by a common second clock signal 192, which is faster than the first clock signal. For example, the second clock signal 192 can be an at-speed functional clock such that BIST operations that are performed with respect to the memories 150(a)-(d) are performed at-speed.

As mentioned above, in prior art BIST circuits, the BIST engine would incorporate a test pattern generator that generates test patterns to be applied to test addresses in each of the memories in parallel. The BIST engine would further incorporate an address generator that, during testing, generates test addresses sufficient to automatically sweep through a maximum possible address space (e.g., 256K addresses) of the specific type of memory under test, even though the actual memories being tested may have smaller total address spaces (e.g., 8192 addresses, 2048 addresses, 512 addresses and 512 addresses as in the memories 150(a), 150(b), 150(c), and 150(d), respectively), thereby wasting a significant amount of test time.

In the BIST circuit 101 disclosed herein, the BIST engine 120 can similarly contain a test pattern generator 122 that generates test patterns and an address generator 125 that generates those test addresses.

The BIST engine 120 can, via the pairs of input/output interface blocks, sweep through the address spaces of each memory 150(a)-(d), writing the test patterns to the memory cells in those memories 150(a)-(d) at the test addresses generated by the address generator 125. The BIST engine 120 can subsequently cause the memory cells at those test addresses in the memories 150(a)-(d) to be read and the data out to be analyzed by comparison logic in the second input/output interface block 140(a)-(d) in order to detect any faulty memory cells in any of the memories 150(a)-(d). Upon detection of faulty memory cells in any the memories 150(a)-(d), the corresponding FARRs 135(a)-(d) can register the failing addresses and can calculate appropriate repair solutions.

It should be noted that the use of both slow and fast input/output interface blocks (i.e., a SBIO and a FBIO) between the BIST engine 120 and each corresponding memory 150(a)-(d) allows the BIST engine 120 and the memories 150(a)-(d) to run at the different clock speeds of the clock signals 191-192. In general, running any logic at a high clock speed requires more power than running at a low clock speed. During test, the memories 150(a)-(d) must be run at their designed clock rate, which is typically relatively high, in order to verify that they will not fail even at the highest clock rate specified. However, since there is no advantage to running the complex BIST engine 120 at the same clock rate as the memories 150(a)-(d) and since running the BIST engine 120 at a high clock speed wastes power, the two different clock signals 191-192 are used and the SBIO and FBIO provide the required support for interfacing the logic across the clock domains and also perform memory specified operations at the same time. Additionally, it should be understood that the general features of BIST circuit, as described within this paragraph, for testing multiple memories in parallel following test address generation are well known in the art and, thus, the details thereof are omitted from this specification in order to allow the reader to focus on the salient aspects of the disclosed.

The address generator 125 can, like prior art address generators, be configured so as to be able to generate test addresses up to a maximum possible address space (e.g., 256K addresses); however, unlike in prior art address generators, the address generator 125 in the BIST engine 120 is also configured to potentially reduce the address space swept so that it is smaller (i.e., has less addresses) than the maximum possible address space in order to reduce overall test time.

Figure 2:
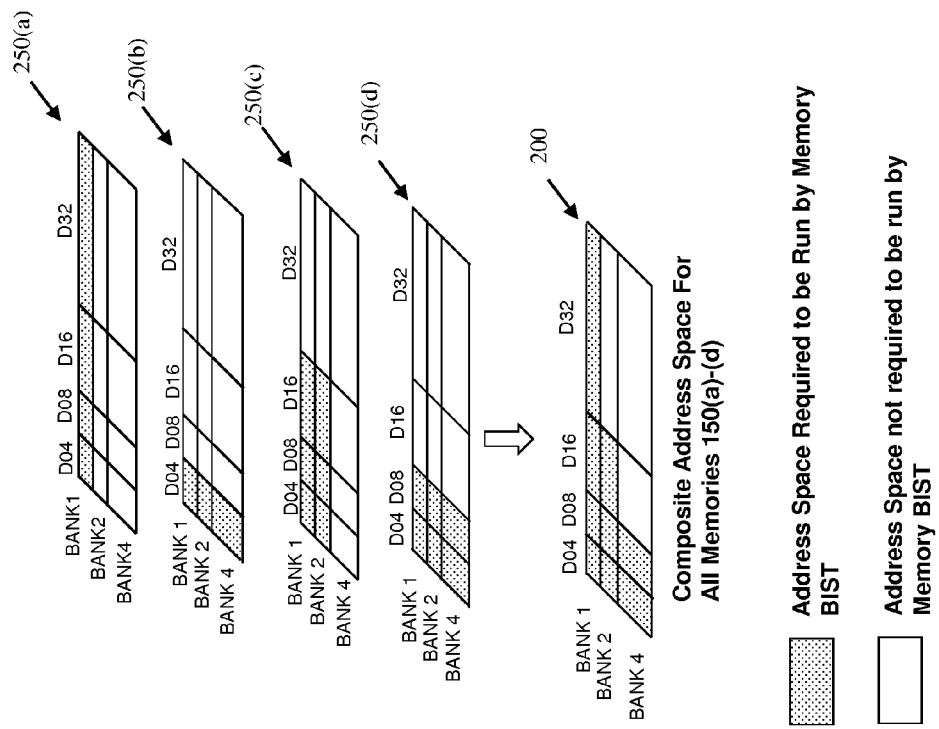
FIG. 2 is a composite chart showing, for all of the memories, the maximum decode numbers per specific bank numbers and the maximum bank numbers per specific decode numbers.
Figure 3:
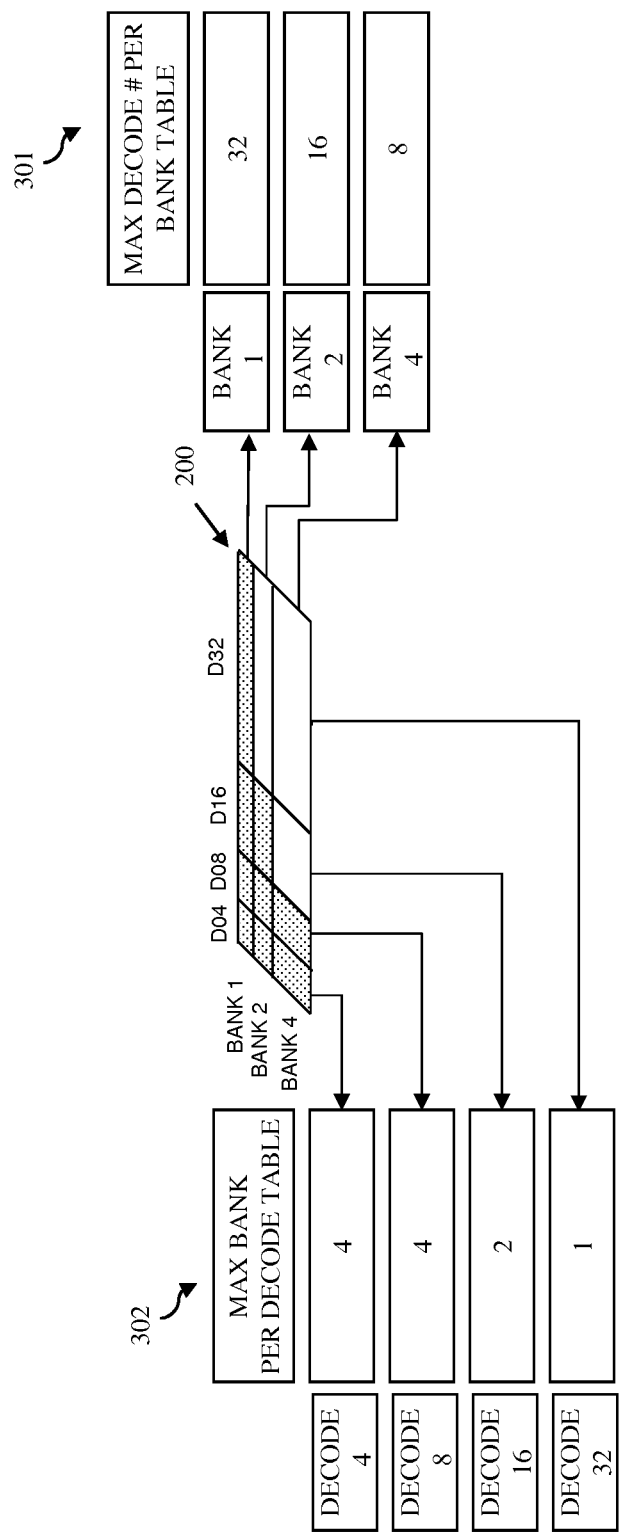
FIG. 3 illustrates a pair of tables associated with the composite chart of FIG. 2, the tables including a first table indicating maximum decode numbers per specific bank numbers and a second table indicating maximum bank numbers per specific decode numbers.

Specifically, the address generator 125 can, prior to testing, generate a pair of tables. These tables can include a first table, which indicates the highest maximum decode numbers per specific bank numbers, respectively, in all of the multiple memories 150(a)-(d) and a second table, which indicates the highest maximum bank numbers per specific decode numbers, respectively, in all of the multiple memories 150(a)-(d). For example, FIG. 2 contains charts 250(a)-(d) illustrating for each of the memories 150(a)-(d), respectively, the maximum bank number and the maximum decode number as compared to the maximum possible number of banks (e.g., 4) and the maximum possible decode number (e.g., Decode 32). In this case, chart 250(a) corresponds to memory 150(a) so Bank 1 is marked off through Decodes 4, 8, 16 and 32; chart 250(b) corresponds to memory 150(b) so Banks 1, 2 and 4 are marked off through Decode 4 only; chart 250(c) corresponds to memory 150(c) so Banks 1 and 2 are marked off through Decodes 4, 8 and 16; and chart 250(d) corresponds to memory 150(d) so Banks 1, 2 and 4 are marked off through Decodes 4 and 8. FIG. 2 further contains a composite chart 200 of the charts 250(a)-(d) with Bank 1 marked off through Decodes 4, 8, 16 and 32, with Bank 2 marked off through Decodes 4, 8 and 16 and with Bank 4 marked off through Decodes 4 and 8. FIG. 3 illustrates a pair of tables associated with the composite chart of FIG. 2. These tables include a first table 301 indicating maximum decode numbers per specific bank numbers and a second table 302 indicating maximum bank numbers per specific decode numbers.

Then, during testing, the address generator 125 can further use a selected one of these tables along with the maximum number of word lines in any of these memories 150(a)-(d) to determine the specific test addresses to generate in sequence and in a dynamic manner. That is, during testing of the multiple memories 150(a)-(d) in parallel, the address generator 125 can sequentially and dynamically generate the specific test addresses to be swept (i.e., the test addresses that will execute test patterns generated by the test pattern generator 122 of the BIST engine during the testing process) and can do so such that all of the specific test addresses generated by the address generator 125 are within a composite address space that is defined by one of the tables (i.e., by either the first table 301 or the second table 302, depending upon the type of address sweep mode being implemented including, but not limited to, an incrementing ripple decode mode, a decrementing ripple decode mode, an incrementing ripple bank mode or a decrementing ripple bank mode, as discussed in greater detail below) and also by a highest maximum word line number in any of the memories 150(a)-(d).

To accomplish this, each first input/output interface block 130(a)-(d) in each pair of input/output interface blocks serially connected between the BIST engine 120 and a corresponding memory 150(a)-(d) can be programmed with (i.e., can store) a set of eight address space values for that corresponding memory 150(a)-(d). The set of eight address space values can include the following: a first address space value, which indicates a first maximum decode number per a first specific bank number (e.g., for Bank 1) in the corresponding memory; a second address space value, which indicates a second maximum decode number per a second specific bank number (e.g., for Bank 2) in the corresponding memory; a third address space value, which indicates a third maximum decode number per a third specific bank number (e.g., for Bank 4) in the corresponding memory; a fourth address space value, which indicates a first maximum bank number per a first specific decode number (e.g., for Decode 4) in the corresponding memory; a fifth address space value, which indicates a second maximum bank number per a second specific decode number (e.g., for Decode 8) in the corresponding memory; a sixth address space value, which indicates a third maximum bank number per a third specific decode number (e.g., for Decode 16) in the corresponding memory; a seventh address space value, which indicates a fourth maximum bank number per a fourth specific decode number (e.g., for Decode 32) in the corresponding memory; and, an eighth address space value, which indicates a maximum word line number per any bank in the corresponding memory.

Each of the different address space values in a set of eight address space values can be represented by a given number of bits (e.g., 4 bits) and these bits can be stored, for example, in single-use storage devices (e.g., fuses, anti-fuses, etc.) (i.e., these bits can be hard programmed in the corresponding first input/output interface block) or stored in any other suitable storage device within the corresponding first input/output interface block. Those skilled in the art will recognize that conventional SBIOs are known to store this information so that test logic contained therein can recognize when test addresses received from a BIST engine during an address sweep for a write or read process go "out-of-bounds" (i.e., are outside the address space) for the corresponding memory. In the integrated circuit chip disclosed herein, this information is not only used by the test logic to determine when test addresses received from the BIST engine 120 during an address sweep go out-of-bounds, but also to limit, if possible, the number of test addresses generated by the address generator 125 for that address sweep.

FIG. 6 shows an exemplary decode and bank bits index. Specifically, FIG. 6 shows 4-bit sequences that can be stored and used to represent each of the different decode or bank number. For example, when the maximum decode number for a given bank is Decode 32, it can be represented by the 4-bit sequence of "1111"; when the maximum decode number for a given bank is Decode 16, it can be represented by the 4-bit sequence of "0111"; when the maximum decode number for a given bank is a Decode 8, it can be represented by the 4-bit sequence of "0011"; when the maximum decode number for a given bank is Decode 4, it can be represented by the 4-bit sequence "0001"; and when there is no decode number, the 4-bit sequence of "0000" can be used. Similarly, when the maximum bank number for a given decode is Bank 4, it can be represented by the 4-bit sequence of "X111"; when the maximum bank number for a given decode is Bank 2, it can be represented by the 4-bit sequence of "X011"; when the maximum bank number for a given decode is Bank 1, it can be represented by the 4-bit sequence of "X001"; and when there is no bank number, the 4-bit sequence of "X000" can be used.

Figure 4:
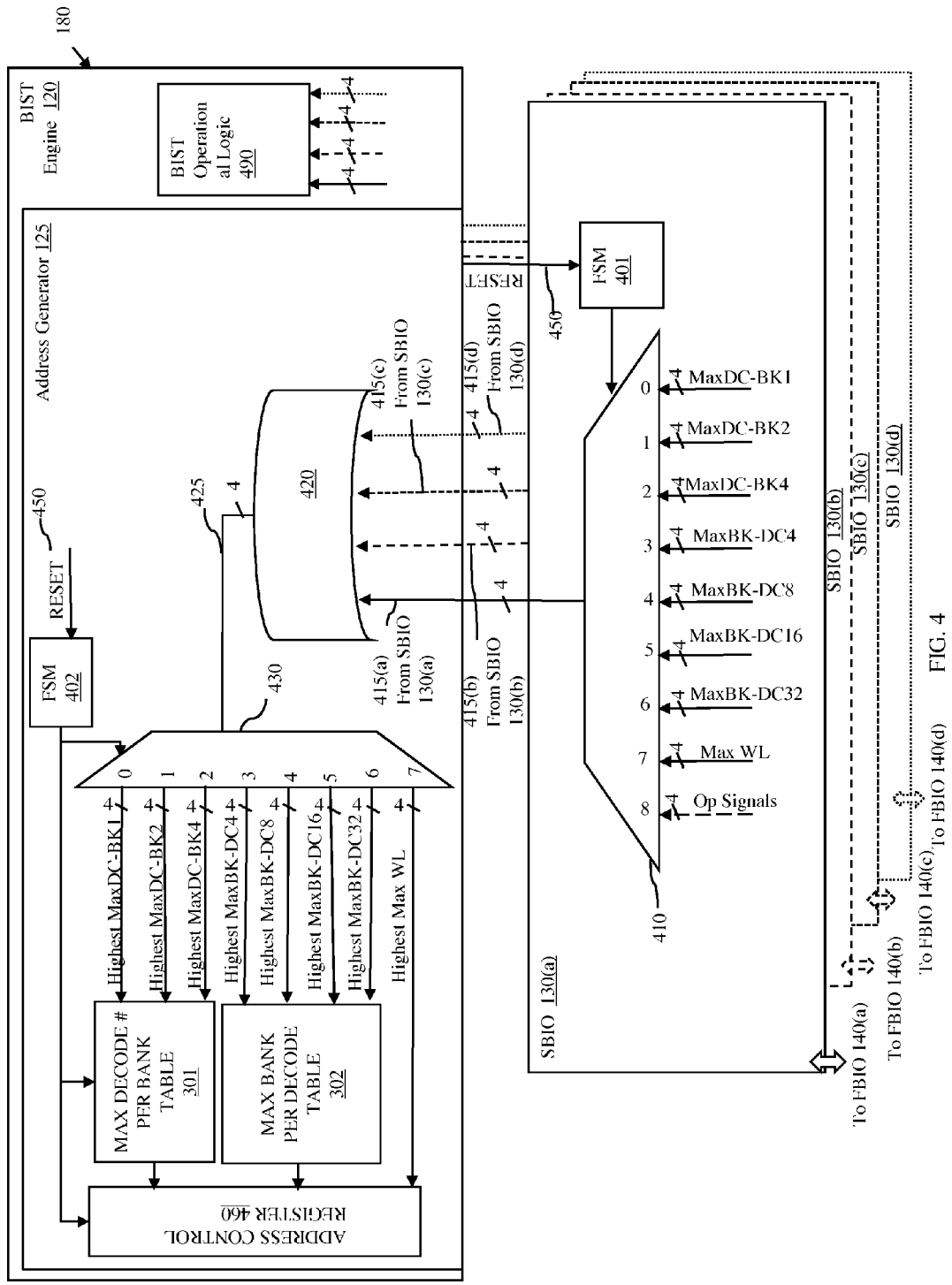
FIG. 4 is a schematic diagram illustrating a portion of the BIST circuit of FIG. 1A, including a BIST engine and first input/output interface blocks.

Additionally, in the BIST circuit 101 disclosed herein, the portion 180 of the BIST circuit 101, including the BIST engine 120 and first input/output interface blocks 130(a)-(d) can be configured, for example, as illustrated in FIG. 4. Referring to FIG. 4, each first input/output interface block 130(a)-(d) in each pair can further contain both a multiplexer 410 and a state machine 401, which controls the multiplexer 410. Specifically, the multiplexer 410 can receive, as eight discrete selectable inputs, the eight different address space values in the set of addresses space values, described above. The state machine 401 can control the multiplexer 410 by outputting different select signals in sequence, thereby causing the multiplexer 410 to output the different address space values in the set in sequence along sets of signal lines 415(a)-(d) to the BIST engine 120, prior to testing. It should be noted that the state machines in each of the first input/output interface blocks 130(a)-(d) should be synchronously operated such that, following receipt of a reset signal 450, each state machine 401 outputs the same select signal at the same time.

Specifically, following receipt by the state machine 401 of a BIST reset signal 450 and prior to testing, the state machine 401 can output eight different select signals in sequence, during consecutive cycles of the first clock signal 191, thereby causing the multiplexer 410 to output, in sequence along the set of specific signal lines 410(a)-(d), each of the eight address space values within the set. For example, as illustrated in FIG. 5, at clock signal "0", each state machine 401 in each first input/output interface block 130(a)-(d) can output a "1000" select signal to its multiplexer 410, thereby causing the multiplexer 410 to output the 4-bit first address space value for the corresponding memory (i.e., the maximum decode value for Bank 1 in that memory). At the next clock signal "1", each state machine 401 in each first input/output interface block can output a "0111" select signal to its multiplexer 410, thereby causing the multiplexer 410 to output the 4-bit second address space value for the corresponding memory (i.e., the maximum decode value for Bank 2 in that memory). At the next clock signal "2", each state machine 401 in each first input/output interface block can output a "0110" select signal to its multiplexer 410, thereby causing the multiplexer 410 to output the 4-bit third address space value for the corresponding memory (i.e., the maximum decode value for Bank 4 in that memory). At the next clock signal "3", each state machine 401 in each first input/output interface block can output a "0101" select signal to its multiplexer 410, thereby causing the multiplexer 410 to output the 4-bit fourth address space value for the corresponding memory (i.e., the maximum bank value for Decode 4 in that memory). At the next clock signal "4", each state machine 401 in each first input/output interface block can output a "0100" select signal to its multiplexer 410, thereby causing the multiplexer 410 to output the 4-bit fifth address space value for the corresponding memory (i.e., the maximum bank value for Decode 8 in that memory). At the next clock signal "5", each state machine 401 in each first input/output interface block can output a "0011" select signal to its multiplexer 410, thereby causing the multiplexer 410 to output the 4-bit sixth address space value for the corresponding memory (i.e., the maximum bank value for Decode 16 in that memory). At the next clock signal "6", each state machine 401 in each first input/output interface block can output a "0010" select signal to its multiplexer 410, thereby causing the multiplexer 410 to output the 4-bit seventh address space value for the corresponding memory (i.e., the maximum bank value for Decode 32 in that memory) 0. At clock signal "7", each state machine 401 in each first input/output interface block can output a "0001" select signal to its multiplexer 410, thereby causing the multiplexer 410 to output the 4-bit eighth address space value for the corresponding memory (i.e., the maximum word address or, more particularly, the maximum number of word lines in that memory).

As mentioned above, the state machines in each of the first input/output interface blocks 130(a)-(d) are synchronously operated such that, following receipt of the reset signal 450, each state machine 401 outputs the same select signal at the same time such that each multiplexer 410 in each of the first input/output interface blocks 130(a)-(d) outputs the same type of address space value at the same time. However, it should be understood that the address space values from the various first input/output interface blocks 130(a)-(d) (e.g., the first address spaces, the second address space values, etc.) will vary depending upon the configuration of the corresponding memory. For example, referring to the chart 250(a) for memory 150(a) shown in FIG. 2, the maximum decode number for Bank 1 is Decode 32; the maximum decode number for Bank 2 is no decode; the maximum decode number for Bank 4 is no decode; the maximum bank number for Decode 4 is Bank 1; the maximum bank number for Decode 8 is Bank 1; the maximum bank number for Decode 16 is Bank 1; and the maximum bank number for Decode 32 is Bank 1. For the chart 250(b) for memory 150(a) shown in FIG. 2, the maximum decode number for Bank 1 is Decode 4; the maximum decode number for Bank 2 is Decode 4; the maximum decode number for Bank 4 is Decode 4; the maximum bank number for Decode 4 is Bank 4; the maximum bank number for Decode 8 is no bank; the maximum bank number for Decode 16 is no bank; and the maximum bank number for Decode 32 is no bank. For the chart 250(c) for memory 150(c) shown in FIG. 2, the maximum decode number for Bank 1 is Decode 16; the maximum decode number for Bank 2 is Decode 16; the maximum decode number for Bank 4 is no decode; the maximum bank number for Decode 4 is Bank 2; the maximum bank number for Decode 8 is Bank 2; the maximum bank number for Decode 16 is Bank 2; and the maximum bank number for Decode 32 is no bank. For the chart 250(d) for memory 150(d) shown in FIG. 2, the maximum decode number for Bank 1 is Decode 8; the maximum decode number for Bank 2 is Decode 8; the maximum decode number for Bank 4 is Decode 8; the maximum bank number for Decode 4 is Bank 4; the maximum bank number for Decode 8 is Bank 4; the maximum bank number for Decode 16 is no bank; and the maximum bank number for Decode 32 is no bank.

It should also be noted that, optionally, the state machine can output nine different select signals in sequence (as opposed to the eight different select signals mentioned above) so as to cause the multiplexer 410 to output, along the sets of signal lines, each of the eight address space values in the set prior to testing and also BIST operational signal(s) during and/or after testing. Thus, the same set of signal lines that are used for transmitting address space value information from the first input/output interface block (e.g., the SBIO) to the BIST engine prior to testing are used to communicate BIST operational signals between the first input/output interface block (e.g., the SBIO) and the BIST engine during and/or after testing. In this case, for example, at clock signal "8", each state machine 401 in each first input/output interface block can output a "0000" select signal to its multiplexer 410, thereby allowing the multiplexer 410 to output BIST operational signal(s), during testing.

In any case, the address generator 125 can receive the sets of eight 4-bit address space values for all of the multiple memories 150(a)-(d) from all first input/output interface blocks 130(a)-(d), respectively, and can generate the pair of tables 301-302 based on those sets. Specifically, the address generator 125 can have comparison logic 420 (e.g., OR gates), a second multiplexer 430, a second state machine 402 and an address control register 460.

The sets 415(a)-(d) of four signal lines from each multiplexer 410 in each first input/output interface block 130(a)-(d), respectively, can be electrically connected to the comparison logic 420 such that the comparison logic 420 receives, as inputs, signals transmitted along those sets 415(a)-(d) of signal lines. Another set of four signal lines 425 can be electrically connected between the comparison logic 420 and the second multiplexer 430. The comparison logic 420 can then operate as follows. Following the clock signal "0", the comparison logic 420 can essentially simultaneously receive first address space values (i.e., the maximum decode value for Bank 1) from the first input/output interface blocks 130(a)-(d) along signal lines 415(a)-(d), can compare all of those first address space values to determine the highest first address space value (i.e., can compare the different maximum decode values for Bank 1 in each of the memories 150(*a*)-(*d*) to determine the highest maximum decode value for Bank 1 in all of the memories 150(*a*)-(*d*)) and can output that highest first address space value as a discrete input to the second multiplexer 430. Following the clock signal "1", the comparison logic 420 can essentially simultaneously receive second address space values (i.e., the maximum decode value for Bank 2) from the first input/output interface blocks 130(*a*)-(*d*) along signal lines 415(*a*)-(*d*), can compare all of those second address space values to determine the highest second address space value (i.e., can compare the different maximum decode values for Bank 2 in each of the memories 150(*a*)-(*d*) to determine the highest maximum decode value for Bank 2 in all of the memories 150(*a*)-(*d*)) and can output that highest second address space value as a discrete input to the second multiplexer 430. Following the clock signal "2", the comparison logic 420 can essentially simultaneously receive third address space values (i.e., the maximum decode value for Bank 4) from the first input/output interface blocks 130(*a*)-(*d*) along signal lines 415(*a*)-(*d*), can compare all of those third address space values to determine the highest third address space value (i.e., can compare the different maximum decode values for Bank 4 in each of the memories 150(*a*)-(*d*) to determine the highest maximum decode value for Bank 4 in all of the memories 150(*a*)-(*d*)) and can output that highest third address space value as a discrete input to the second multiplexer 430. Following the clock signal "3", the comparison logic 420 can essentially simultaneously receive fourth address space values (i.e., the maximum bank value for Decode 4) from the first input/output interface blocks 130(*a*)-(*d*) along signal lines 415(*a*)-(*d*), can compare all of those fourth address space values to determine the highest fourth address space value (i.e., can compare the different maximum bank values for Decode 4 in each of the memories 150(*a*)-(*d*) to determine the highest maximum bank value for Decode 4 in all of the memories 150(*a*)-(*d*)) and can output that highest fourth address space value as a discrete input to the second multiplexer 430. Following the clock signal "4", the comparison logic 420 can essentially simultaneously receive fifth address space values (i.e., the maximum bank value for Decode 8) from the first input/output interface blocks 130(*a*)-(*d*) along signal lines 415(*a*)-(*d*), can compare all of those fifth address space values to determine the highest fifth address space value (i.e., can compare the different maximum bank values for Decode 8 in each of the memories 150(*a*)-(*d*) to determine the highest maximum bank value for Decode 8 in all of the memories 150(*a*)-(*d*)) and can output that highest fifth address space value as a discrete input to the second multiplexer 430. Following the clock signal "5", the comparison logic 420 can essentially simultaneously receive sixth address space values (i.e., the maximum bank value for Decode 16) from the first input/output interface blocks 130(*a*)-(*d*) along signal lines 415(*a*)-(*d*), can compare all of those sixth address space values to determine the highest sixth address space value (i.e., can compare the different maximum bank values for Decode 16 in each of the memories 150(*a*)-(*d*) to determine the highest maximum bank value for Decode 16 in all of the memories 150(*a*)-(*d*)) and can output that highest sixth address space value as a discrete input to the second multiplexer 430. Following the clock signal "6", the comparison logic 420 can essentially simultaneously receive seventh address space values (i.e., the maximum bank value for Decode 16) from the first input/output interface blocks 130(*a*)-(*d*) along signal lines 415(*a*)-(*d*), can compare all of those seventh address space values to determine the highest seventh address space value (i.e., can compare the different maximum bank values for Decode 32 in each of the memories 150(*a*)-(*d*) to determine the highest maximum bank value for Decode 32 in all of the memories 150(*a*)-(*d*)) and can output that highest seventh address space value as a discrete input to the second multiplexer 430. Following the clock signal "7", the comparison logic 420 can essentially simultaneously receive eighth address space values (i.e., the maximum word line values) from the first input/output interface blocks 130(*a*)-(*d*) along signal lines 415(*a*)-(*d*), can compare all of those eighth address space values to determine the highest eighth address space value (i.e., can compare the different maximum word line values in each of the memories 150(*a*)-(*d*) to determine the highest maximum word line number in any of the memories 150(*a*)-(*d*)) and can output that highest eighth address space value as a discrete input to the second multiplexer 430.

The second state machine 402 can also receive the BIST reset signal 450 and, during consecutive clock cycles of the first clock signal 191 following receipt of that BIST reset signal 450 can output eight different select signals (e.g., the same select signals referenced above) in sequence, thereby causing the second multiplexer 430 to output the following values in sequence: the highest first address space value (e.g., the highest maximum decode number per Bank 1 in any of the memories), the highest second address space value (e.g., the highest maximum decode number per Bank 2 in any of the memories), the highest third address space value (e.g., the highest maximum decode number per Bank 4 in any of the memories), the highest fourth address space value (e.g., the highest maximum bank number per Decode 4 in any of the memories), the highest fifth address space value (e.g., the highest maximum bank number per Decode 8 in any of the memories), the highest sixth address space value (e.g., the highest maximum bank number per Decode 16 in any of the memories), the highest seventh address space value (e.g., the highest maximum bank number per Decode 32 in any of the memories) and the highest eighth address space value (e.g., the highest maximum word line number in any of the memories).

Of these values, the highest first address space value (e.g., the highest maximum decode number per Bank 1 in any of the memories), the highest second address space value (e.g., the highest maximum decode number per Bank 2 in any of the memories), and the highest third address space value (e.g., the highest maximum decode number per Bank 4 in any of the memories) can be loaded into the first table 301. Of these values, the highest fourth address space value (e.g., the highest maximum bank number per Decode 4 in any of the memories), the highest fifth address space value (e.g., the highest maximum bank number per Decode 8 in any of the memories), the highest sixth address space value (e.g., the highest maximum bank number per Decode 16 in any of the memories), and the highest seventh address space value (e.g., the highest maximum bank number per Decode 32 in any of the memories) can be loaded into the second table 302. Finally, the highest eighth address space value (e.g., the highest maximum word line number in any of the memories) can be loaded directly into the address control register 460

During testing, the BIST controller 110 can set the testing mode and, based on that testing mode, the second state machine 402 causes various values, which were previously loaded into a selected one of the tables, to be dynamically loaded into the address control register 460 and, thereby used to control test address generation and, particularly, to mask addresses outside the composite address space.

For example, the BIST controller 110 can set the testing mode as an incrementing ripple decode mode. In an incrementing ripple decode mode, testing is performed by incrementing the decode number with each new test address generated. Specifically, the address generator 125 generates test addresses by rippling through decode numbers in a specific bank number from low to high and then proceeding to the next specific bank number. In this case, the address generator 125 accesses the first table 301 following execution of a test address at a specific test address within a specific bank number and determines whether to execute the test pattern at an address with the next highest decode number by determining whether or not the maximum decode number for that specific bank number, as indicated by the first table, has been reached. If so, generation of test addresses with that specific bank number is terminated and rippling through the decode numbers in the next specific bank number will begin and so on.

Alternatively, the BIST controller 110 can set the testing mode as a decrementing ripple decode mode. In a decrementing ripple decode mode, testing is performed by decrementing the decode number with each new test address generated. In this case, the address generator 125 accesses the first table 301 and generates an initial test address in a specific bank number using a maximum decode number for that specific bank number, as indicated by the first table 301. Additional test addresses are generated by rippling through decode numbers in the specific bank number from high to low and then proceeding to the next specific bank number.

Alternatively, the BIST controller 110 can set the testing mode as an incrementing ripple bank mode. In an incrementing ripple bank mode, testing is performed by incrementing the bank number with each new test address generated. The address generator 125 generates test addresses by rippling through bank numbers for specific decode numbers from low to high and then proceeding to the next specific bank number. In this case, the address generator 125 accesses the second table 302 following execution of a test address at a specific test address with a specific decode number and determines whether to execute the test pattern at an address with the next highest bank number by determining whether or not the maximum bank number for that specific decode number, as indicated by the second table, has been reached. If so, generation of test addresses with that specific decode number is terminated and rippling through the bank numbers for the next specific decode number will begin and so on.

Alternatively, the BIST controller 110 can set the testing mode as a decrementing ripple bank mode. In a decrementing ripple bank mode, testing is performed by decrementing the bank number with each new test address generated. In this case, the address generator 125 accesses the second table 302 and generates an initial test address for a specific decode number using a maximum bank number for that specific decode number, as indicated by the second table 302. Additional test addresses are generated by rippling through bank numbers for specific decode number from high to low and then proceeding to the next specific decode number.

It should be understood that in each of these modes no test addresses would be generated that have a word line number above a highest maximum word line number for all of the memories 150(a)-(d) are generated.

Figure 7:
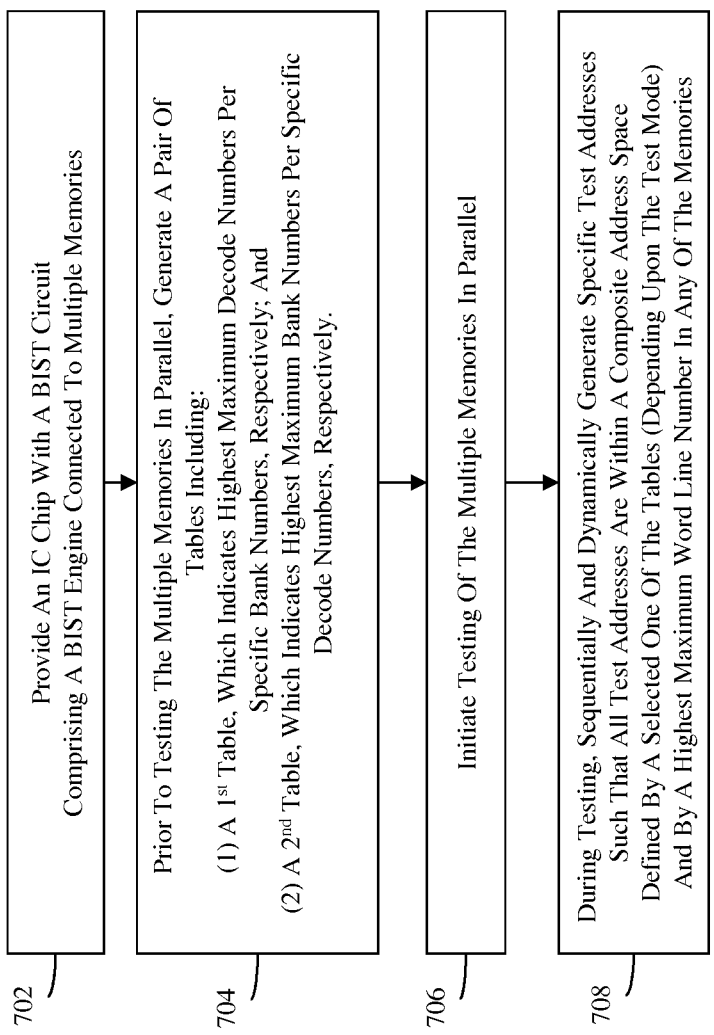

Referring to the flow diagram of FIG. 7, also disclosed herein is a built-in self-test (BIST) method for testing multiple memories in parallel on an integrated circuit chip. The method can begin by providing an integrated circuit chip, such as the integrated circuit chip 100, which is described in detail above and illustrated in FIGS. 1A-1B and in part in FIG. 3 and which has multiple memories 150(a)-(d) and a BIST circuit 101 with a BIST engine 120 for testing those multiple memories 150(a)-(d) in parallel (702). Each of these memories can be associated with a maximum possible address space. These memories 150(a)-(d) can have the exact same configuration (e.g., the same number of banks, the same number of word lines per bank and the same decode number per data bit column such that they each have the same total address space). Alternatively, any two or more of the memories 150(a)-(d) can have different configurations (e.g., different numbers of banks, different numbers of word lines per bank and/or different decode numbers per data bit column) such that they have different total address spaces.

In any case, in this method, prior to testing the multiple memories, a pair of tables can be generated by the address generator 125 of the BIST engine 120, which, as discussed above, is electrically connected to multiple memories 150(a)-(d) (704). The pair of tables can, as illustrated in FIG. 3, include a first table 301, which indicates the highest maximum decode numbers per specific bank numbers in all of the multiple memories 150(a)-(d), and a second table 302, which indicates the highest maximum bank numbers per specific decode numbers in all of the multiple memories 150(a)-(d). Following generation of these tables 301-302, testing of the multiple memories 150(a)-(d) in parallel by the BIST engine 120 can be initiated (606). During this testing process, specific test addresses to which test patterns will be applied can be sequentially and dynamically generated by the address generator 125 such that they are all within a composite address space defined by one of the tables (i.e., either the first table or the second table, depending upon the address sweep mode being used) and by the highest maximum word line number in any of the multiple memories 150(a)-(d) (708).

For example, at process 708, the testing mode can be set by the BIST controller 110 and, based on that testing mode, various values, which were previously loaded into a selected one of the tables, can be dynamically loaded into the address control register 460.

Specifically, at process 708, the testing mode can be set as an incrementing ripple decode mode. In an incrementing ripple decode mode, testing is performed by incrementing the decode number with each new test address generated. Specifically, test addresses are generated by the address generator 125 by rippling through decode numbers in a specific bank number from low to high and then proceeding to the next specific bank number. In this case, the first table 301 is accessed by the address generator 125 following execution of a test address at a specific test address within a specific bank number and a determination is made by the address generator 125 as to whether or not the maximum decode number for that specific bank number, as indicated by the first table 301, has been reached. If so, generation of test addresses with that specific bank number is terminated and rippling through the decode numbers in the next specific bank number will begin and so on.

Alternatively, at process 708, the testing mode can be set as a decrementing ripple decode mode. In a decrementing ripple decode mode, testing is performed by decrementing the decode number with each new test address generated. In this case, the first table 301 is accessed and an initial test address in a specific bank number is generated by the address generator 125 using a maximum decode number for that specific bank number, as indicated by the first table 301. Additional test addresses are generated by rippling through decode numbers in the specific bank number from high to low and then proceeding to the next specific bank number.

Alternatively, at process 708, the testing mode can be set as an incrementing ripple bank mode. In an incrementing ripple bank mode, testing is performed by incrementing the bank number with each new test address generated. Specifically, test addresses are generated by rippling through bank numbers for specific decode numbers from low to high and then proceeding to the next specific bank number. In this case, the second table 302 is accessed following execution of a test address at a specific test address with a specific decode number and a determination is made by the address generator 125 as to whether or not the maximum bank number for that specific decode number, as indicated by the second table 302, has been reached. If so, generation of test addresses with that specific decode number is terminated and rippling through the bank numbers for the next specific decode number will begin and so on.

Alternatively, at process 708, the testing mode can be set as a decrementing ripple bank mode. In a decrementing ripple bank mode, testing is performed by decrementing the bank number with each new test address generated. In this case, the second table 302 can be accessed and an initial test address for a specific decode number is generated by the address generator 125 using a maximum bank number for that specific decode number, as indicated by the second table 302. Additional test addresses are generated by rippling through bank numbers for specific decode number from high to low and then proceeding to the next specific decode number.

It should be understood that in each of these modes no test addresses would be generate with a word line number above a highest maximum word line number for all of the memories 150(*a*)-(*d*).

Thus, depending upon the actual configuration of the memories 150(*a*)-(*d*), the address space swept during testing may be less than the maximum possible address space associated with the multiple memories 150(*a*)-(*d*) and the overall time required for test may be significantly reduced.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above is integrated circuit chip with multiple memories and a built-in self-test (BIST) circuit. The BIST circuit can have a BIST engine, which is electrically connected to the multiple memories, which tests those multiple memories in parallel, and which incorporates an address generator configured to minimize that address space swept during testing. Prior to testing of the multiple memories, the address generator can generate a pair of tables. The tables can include a first table, which indicates the highest decode numbers per specific bank numbers in all of the multiple memories, and a second table, which indicates the highest bank numbers per specific decode numbers in all of the multiple memories. Then, during testing of the multiple memories, the address generator can sequentially and dynamically generate the specific test addresses to be swept and can do so such that all of the specific test addresses are within a composite address space that is defined by one of the tables (i.e., by either the first table or the second table, depending upon the address sweep mode being used) and by the highest maximum word line number in any of the memories. Also disclosed herein is an associated built-in self-test method for test multiple memories.

What is claimed is:

1. An integrated circuit chip comprising:
   multiple memories;
   a built-in self-test engine electrically connected to the multiple memories; and,
   a controller controlling the built-in self-test engine,
   the built-in self-test engine testing the multiple memories and comprising an address generator generating and storing a pair of tables, the pair of tables comprising:
     a first table indicating highest maximum decode numbers per specific bank numbers in all of the multiple memories; and,
     a second table indicating highest maximum bank numbers per specific decode numbers in all of the multiple memories,
   the controller setting a testing mode,
   the testing mode being one of multiple possible testing modes and being indicative of a selected one of the tables in the pair of tables, and
   the address generator further sequentially and dynamically generating specific test addresses to be swept during the testing of the multiple memories such that all of the specific test addresses are within a composite address space defined by the selected one of the tables and by a highest maximum word line number in any of the multiple memories.

2. The integrated circuit chip of claim 1, the multiple memories comprising at least two memories with at least one of different maximum decode numbers and different maximum bank numbers so as to have different total address spaces.

3. The integrated circuit chip of claim 1, further comprising:

pairs of serially connected input/output interface blocks electrically connecting the multiple memories in parallel to the built-in self-test engine, each pair of serially connected input/output interface blocks comprising a first input/output interface block connected to the built-in self-test engine and a second input/output interface block connected between the first input/output interface block and a corresponding memory, each first input/output interface block in each pair storing a set of address space values for the corresponding memory.

4. The integrated circuit chip of claim 3, each first input/output interface block comprising a multiplexer and a state machine controlling the multiplexer by outputting different select signals in sequence so as to cause the multiplexer to output, to the built-in self-test engine in sequence, each of the address space values for the corresponding memory.

5. The integrated circuit chip of claim 4, the different select signals being output by the state machine in sequence during consecutive clock cycles following receipt by the state machine of a reset signal and all of the state machines in all of the first input/output interface blocks being synchronously operated.

6. The integrated circuit chip of claim 4, wherein the specific test addresses are swept during the testing by applying test patterns to memory cells at the specific test addresses.

7. The integrated circuit chip of claim 1, the testing being performed by the built-in self-test engine in a ripple decode mode and the address generator using the first table to generate the specific test addresses.

8. The integrated circuit chip of claim 1, the testing being performed by the built-in self-test engine in a ripple bank mode and the address generator using the second table to generate the specific test addresses.

9. An integrated circuit chip comprising:
multiple memories;
a built-in self-test engine;
a controller controlling the built-in self-test engine; and,
pairs of serially connected input/output interface blocks electrically connecting the multiple memories in parallel to the built-in self-test engine,
    each pair of serially connected input/output interface blocks comprising a first input/output interface block connected to the built-in self-test engine and a second input/output interface block connected between the first input/output interface block and a corresponding memory, and
    each first input/output interface block in each pair storing a set of address space values for the corresponding memory and comprising a multiplexer and a state machine, the state machine controlling the multiplexer by outputting different select signals in sequence so as to cause the multiplexer to output, to the built-in self-test engine in sequence, each of the address space values in the set and an operational signal,
the built-in self-test engine testing the multiple memories in parallel and comprising an address generator,
the address generator receiving sets of address space values for all of the multiple memories from all first input/output interface blocks, respectively, and, based on the sets, generating and storing a pair of tables, the pair of tables comprising:

a first table indicating highest maximum decode numbers per specific bank numbers in all of the multiple memories; and,
a second table indicating highest maximum bank numbers per specific decode numbers in all of the multiple memories,
the controller setting a testing mode,
the testing mode being one of multiple possible testing modes and being indicative of a selected one of the tables in the pair of tables, and
the address generator further sequentially and dynamically generating specific test addresses to be swept during the testing of the multiple memories such that all of the specific test addresses are within a composite address space defined by the selected one of the tables and by a highest maximum word line number in any of the multiple memories.

10. The integrated circuit chip of claim 9, the multiple memories comprising at least two memories with at least one of different maximum decode numbers and different maximum bank numbers so as to have different total address spaces.

11. The integrated circuit chip of claim 9,
the set of address space values comprising at least:
a first address space value comprising a first maximum decode number per a first specific bank number in the corresponding memory;
a second address space value comprising a second maximum decode number per a second specific bank number in the corresponding memory;
a third address space value comprising a third maximum decode number per a third specific bank number in the corresponding memory;
a fourth address space value comprising a first maximum bank number per a first specific decode number in the corresponding memory;
a fifth address space value comprising a second maximum bank number per a second specific decode number in the corresponding memory;
a sixth address space value comprising a third maximum bank number per a third specific decode number in the corresponding memory;
a seventh address space value comprising a fourth maximum bank number per a fourth specific decode number in the corresponding memory; and,
an eighth address space value comprising a highest maximum word line number in the corresponding memory.

12. The integrated circuit chip of claim 11,
the different select signals being output in sequence during consecutive clock cycles following receipt by the state machine of a reset signal,
the address generator comprising comparison logic,
the comparison logic essentially simultaneously receiving first address space values from the first input/output interface blocks, comparing the first address space values and outputting a highest first address space value to the first table via an additional multiplexer,
the comparison logic essentially simultaneously receiving second address space values from the first input/output interface blocks, comparing the second address space values and outputting a highest second address space value to the first table via the additional multiplexer,
the comparison logic essentially simultaneously receiving third address space values from the first input/output interface blocks, comparing the third address space values and outputting a highest third address space value to the first table via the additional multiplexer, the comparison logic essentially simultaneously receiving fourth address space values from the first input/output interface blocks, comparing the fourth address space values and outputting a highest fourth address space value to the second table via the additional multiplexer,
the comparison logic essentially simultaneously receiving fifth address space values from the first input/output interface blocks, comparing the fifth address space values and outputting a highest fifth address space value to the second table via the additional multiplexer,
the comparison logic essentially simultaneously receiving sixth address space values from the first input/output interface blocks, comparing the sixth address space values and outputting a highest sixth address space value to the second table via the additional multiplexer,
the comparison logic essentially simultaneously receiving seventh address space values from the first input/output interface blocks, comparing the seventh address space values and outputting a highest seventh address space value to the second table via the additional multiplexer, and
the comparison logic essentially simultaneously receiving eighth address space values from the first input/output interface blocks, comparing the eighth address space values and outputting a highest eight address space value to an address control register via the additional multiplexer.

13. The integrated circuit chip of claim 9, the testing being performed by the built-in self-test engine in a ripple decode mode and the address generator using the first table to generate the specific test addresses.

14. The integrated circuit chip of claim 9, the testing being performed by the built-in self-test engine in a ripple bank mode and the address generator using the second table to generate the specific test addresses.

15. A method comprising:
providing an integrated circuit chip comprising multiple memories, a built-in self-test engine electrically connected to the multiple memories, and a controller controlling the built-in self-test engine;
generating and storing a pair of tables, the pair of tables being generated by an address generator of the built-in self-test engine and the pair of tables comprising:
a first table indicating highest decode numbers per specific bank numbers in all of the multiple memories; and,
a second table indicating highest bank numbers per specific decode numbers in all of the multiple memories;
setting, by the controller, a testing mode, the testing mode being one of multiple possible testing modes and being indicative of a selected one of the tables in the pair of tables; and
testing, by the built-in self-test engine, the multiple memories in parallel and, during the testing, sequentially and dynamically generating, by the address generator, specific test addresses to be swept during the testing such that all of the specific test addresses are within a composite address space defined by the selected one of the tables and by a highest maximum word line number in any of the multiple memories.

16. The method of claim 15, the multiple memories comprising at least two memories with at least one of different maximum decode numbers and different maximum bank numbers so as to have different total address spaces.

17. The method of claim 15, the testing being performed in an incrementing ripple decode mode and the specific test addresses being generated by using the first table.

18. The method of claim 15, the testing being performed in a decrementing ripple decode mode and the specific test addresses being generated using the first table.

19. The method of claim 15, the testing being performed in an incrementing ripple bank mode and the specific test addresses being generated using the second table.

20. The method of claim 15, the testing being performed in a decrementing ripple bank mode and the specific test addresses being generated using the second table.

* * * * *